United States Patent [19]

Machdao

[11] Patent Number: 4,772,984
[45] Date of Patent: Sep. 20, 1988

[54] APPARATUS FOR POSITIONING A PLURALITY OF ITEMS ALONG AN INCLINED TRACK

[75] Inventor: Joseph F. Machdao, Santa Ana, Calif.

[73] Assignee: Quality Automation, Inc., Anaheim, Calif.

[21] Appl. No.: 47,340

[22] Filed: May 6, 1987

[51] Int. Cl.⁴ .................. H01G 4/00; G01R 31/02; B07C 5/08
[52] U.S. Cl. ....................... 361/301; 209/573; 364/550
[58] Field of Search ............... 209/573, 574; 221/123, 221/124; 364/550; 324/73 PC; 361/301

[56] References Cited

U.S. PATENT DOCUMENTS

| | | | |
|---|---|---|---|
| 4,324,600 | 4/1982 | Bankes et al. | 209/573 X |
| 4,436,619 | 3/1984 | Petrov et al. | 209/573 |
| 4,686,637 | 8/1987 | Linker et al. | 364/550 |
| 4,704,700 | 11/1987 | Linker et al. | 364/550 |

Primary Examiner—Donald A. Griffin
Attorney, Agent, or Firm—Lawrence M. Nawrocki

[57] ABSTRACT

An equipment (10) designed to engage and stop each of a plurality of items (16) passing down a track (12). The equipment (10) includes a mount (28) which carries a plurality of stops (30). The stops (30) are disposed such that, when the mount (28) which is spaced laterally from the track (12) is moved toward the track (12), stops (30) will successively obstruct the track (12) in sequence, consecutively in a direction upwardly along an axis along which the stops (30) are spaced.

15 Claims, 3 Drawing Sheets

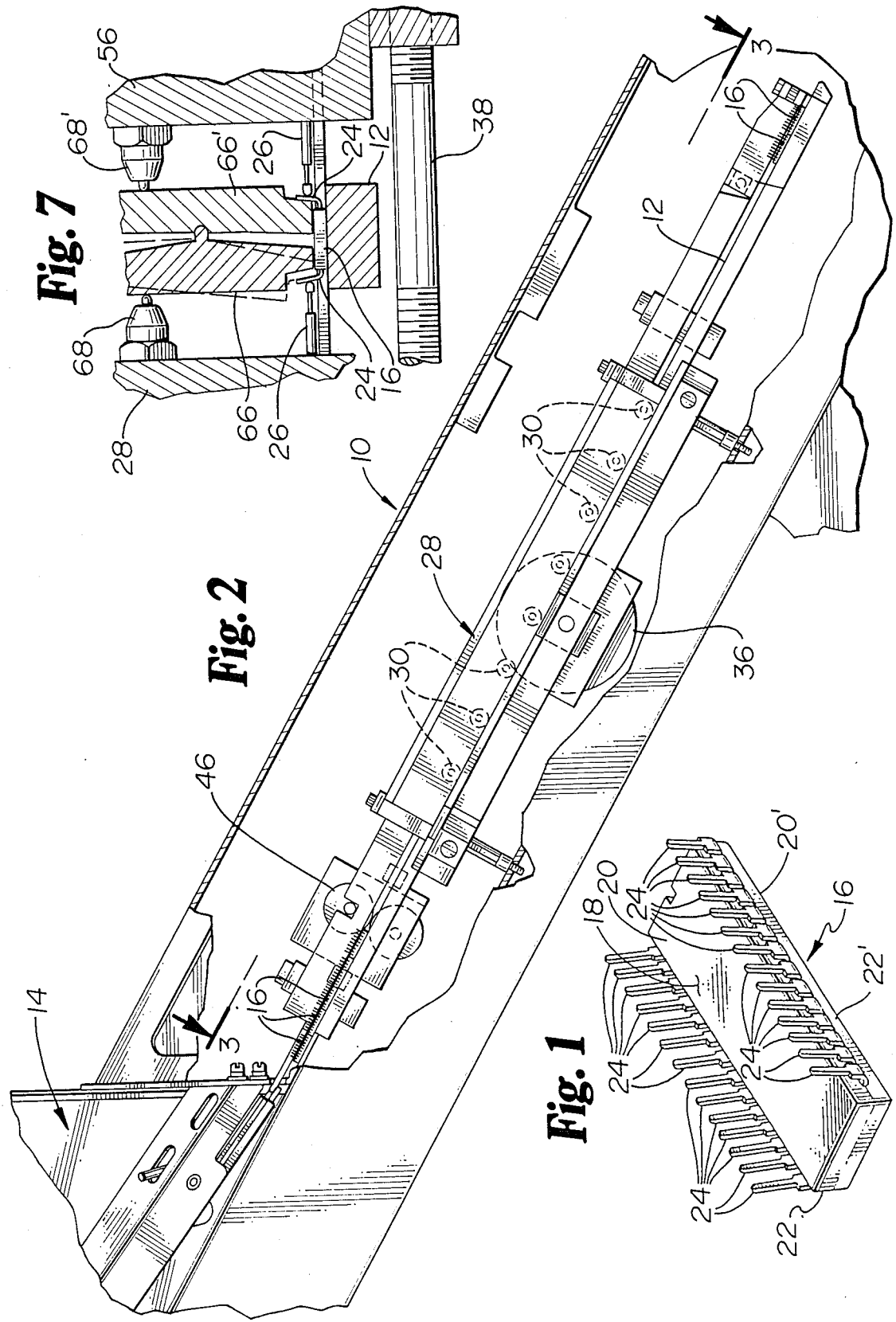

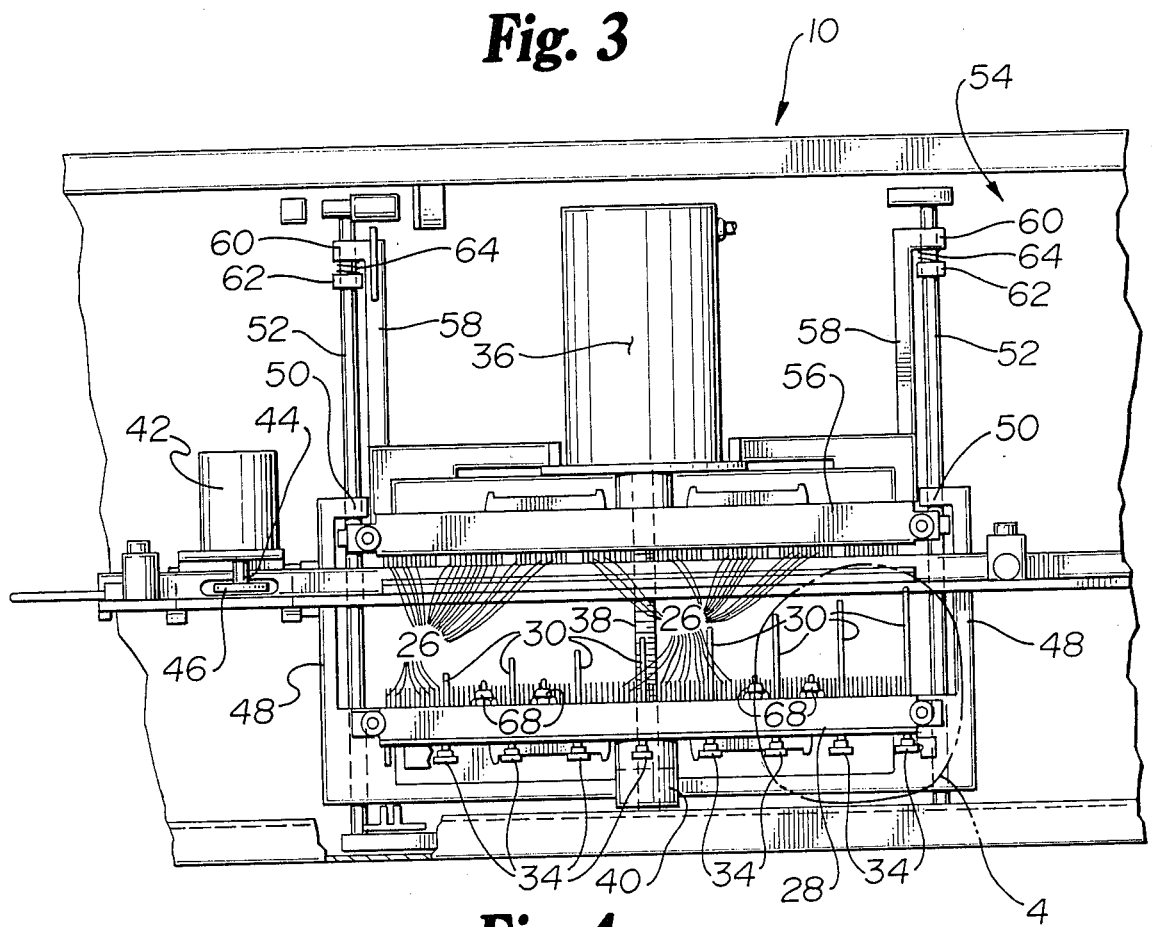
Fig. 3
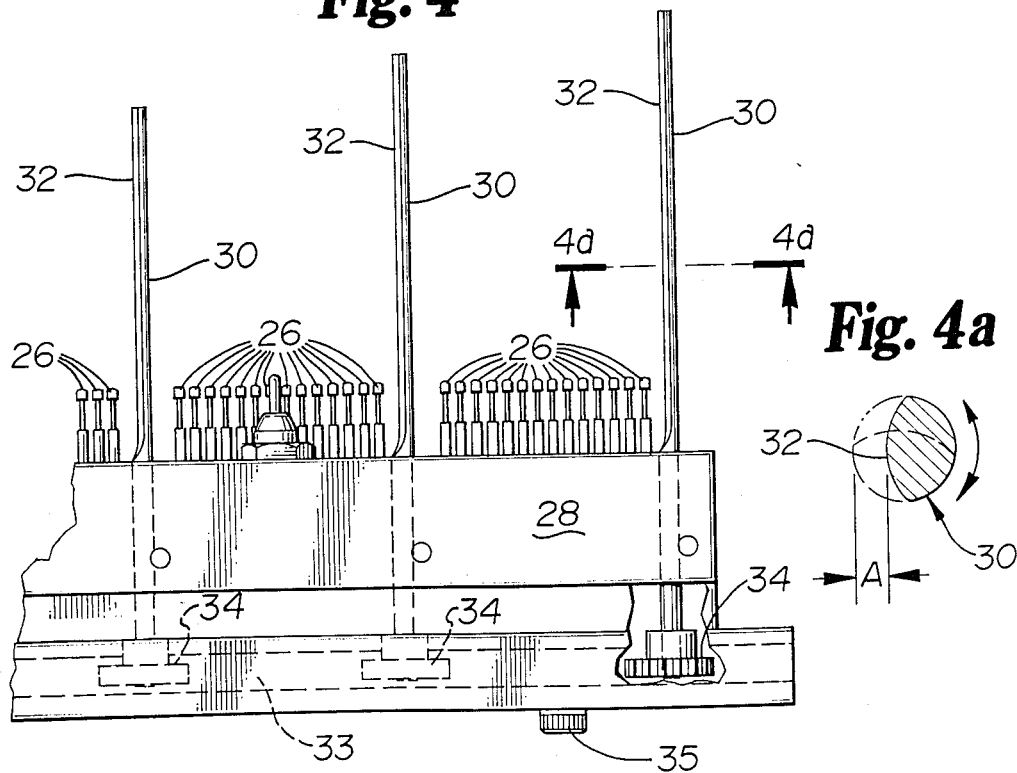
Fig. 4
Fig. 4a

APPARATUS FOR POSITIONING A PLURALITY OF ITEMS ALONG AN INCLINED TRACK

TECHNICAL FIELD

The present invention deals broadly with technology wherein items are allowed to pass down an inclined track to be stopped and positioned at various defined stations therealong at which processing of some nature is worked upon the items. More narrowly, however, the invention deals with such apparatus intended to be employed in EPROM programming. A specific embodiment of the invention is directed to such a programming device intended to be used to cycle dual in-line packages (DIPs) through a plurality of stations, each of the devices at the stations being simultaneously tested for shorts by driving current therethrough and programmed by the application of voltage to particular contacts thereof.

BACKGROUND OF THE INVENTION

The revolution in the electronics industry which has occurred in the last few decades has, in significant part, been occasioned by the development of the integrated circuit. Because of the development of that item, many new products not previously available have been made available in various markets. These include the consumer-oriented, industrial, and governmental markets.

Not many years ago, devices such as personal computers were certainly not readily available. It has come to be, however, that the residence without a personal computer is the exception rather than the rule.

One type of integrated circuit which is typically used in many electronic devices, such as computers, which is available because of the development of integrated circuits is known as an EPROM. This acronym stands for "erasable programmable read-only memory". Such devices can typically take one of various forms. One typical, and frequently employed, configuration is that known as a DIP. Other such devices can take the configuration of an LCC (leadless chip carrier) or other packages.

DIPs are microcircuit packages with two rows of contacts. Each row extends from one of opposite lateral edges of a main body of the device and generally perpendicular thereto. Each row can vary in the number of leads it includes. Typically, however, between seven and twenty contacts are provided in each row. The spider-like structure formed by the contacts and the main body portion of the device renders the device capable of being easily inserted into a circuit board.

LCCs are microcircuit packages with contacts which do not extend beyond the edges of the device. Such devices are surface-mounted on etched circuit boards.

Since some of the devices described immediately above are erasable and programmable, various types of equipments have been designed to accomplish the programming function. The equipment is provided with one or more master devices, the memory of which is to be dubbed onto various EPROM devices which are passed through the machine. Typically, passage of the devices to be programmed is effected by allowing them to slide, under the influence of gravity, down an inclined track. Multiple stations are defined at various locations along the track so that a plurality of EPROMs can be simultaneously programmed.

When a device to be dubbed is at a desired station, or a plurality of devices are at a corresponding plurality of stations, the signature to be imposed is applied only after first testing the devices for shorts. This is accomplished by driving current through the devices and ascertaining the flow characteristics.

Progamming is, thereafter, completed. This is brought about by applying a defined voltage to various contact pins. before releasing the devices to a station at which they are marked with appropriate indicia, correct programming is verified.

Electronic connectors are made to engage the contact pins of the devices to be programmed in order to effect the driving of current through the device and the application of voltage thereto. Typically, the electronic connectors take the form of "pogo pins". Such pins are biased toward a position in which they engage the contact pins of a device at a station of which a particular pin is a part. They are, however, spring-loaded so that there will be a cushion in order that the contact pins of the devices to be programmed not be damaged.

Various diffferent types of stops have been employed for engaging a device when it is at an appropriate position and in station relative to corresponding "pogo pins". These stops, as known in the prior art, however, tend to be overly intricate and complicated.

Additionally, many of such stops, do not take into account the fragility of the devices which are intended to be programmed. Many EPROMs are made of materials which are brittle, and many devices employed as stops in the prior art have no give when they are contacted by a device passing down the track. Consequently, the possibility to damage to a significant number of the devices to be programmed escalates.

Additionally, the same programming equipment is, it is desired, used to program EPROMs of different dimensions in a direction axial with respect to the track down which they pass. Consequently, the axial position of engagment of the EPROM with its respective stop must be able to be varied depending upon the relative location of the contact pins with respect to the axial dimension of the device. Many devices known in the prior art do not enable such an adjustment.

When the particular EPROMs being programmed are DIPs, additional problems are encountered. The contact pins of such devices are easily deformable, and, often, the engagement of the pins by the "pogo pin" electronic connectors can result in inadvertant bending. This is particularly true should one or more of the "pogo pins" become jammed so that there is no telescoping of the contact portion relative to the rest of the pin.

It is to these problems and dictates of the prior art that the present invention is directed. It is an improved equipment which makes significant strides towards solving the problems of the prior art.

SUMMARY OF THE INVENTION

The present invention is an equipment which engages and stops each of a plurality of items such as EPROMs passing down a track. Engagement effects positioning of each of the items at an intended location along the track. The equipment includes a mount which is, normally, spaced to one side of the track and disposed for movement toward and away from the track. The mount carries a plurality of stops which are rigidly affixed thereto. The stops are spaced along an axis generally parallel to an axis along which the devices pass down the track. The stops are disposed relative to one another so that, as the mount moves toward the track, each stop successively obstructs the track in a sequence, consecutively in a direction upwardly along the axis along which the stops are spaced. The equipment further includes means for selectively moving the mount toward and away from the track.

In the preferred embodiment, the mount is oriented generally parallel to the axis along which the devices pass down the track. It is envisioned that the stops would be generally parallel to one another and define paths of movement substantially perpendicular to the axis along which the devices pass down the track. A preferred structure in accordance with the invention would employ stops spaced from one another at substantially equal distances.

Each stop can be substantially circular in cross-section and have an eccentric portion at a location therealong at which it is engaged by a device on the track. By rotating a particular stop, therefore, the axial location along the track at which a device is stopped can be varied.

It will be seen that, in the preferred embodiment, the mount can be moved incrementally toward the track so that, as the mount is moved an increment, an additional stop would be moved into position obstructing the track. A singulator can be employed to release an additional EPROM when a next stop sequentially higher along the track is brought into position wherein it obstructs the track. A single AC synchronous motor can be employed to effect this incremental movement.

The stops can be elongated members extending from the mount in a cantilever fashion. Consequently, the stops will have a measure of resiliancy so that, as one is engaged by a device passing down the track, it will bow to absorb some of the impact of the device. The greater the length at which a stop is cantilevered, the greater its resiliancy will be.

The electronic connectors, which may take the form of spring contact probes, are mounted and disposed for movement into engagement with an integrated circuit device at a station along the track. Means can be provided for supporting contact pins of DIPs, when such devices are being programmed, to deter deformation of the contacts when they are engaged by the spring contact probes. Such means can comprise a wing, associated with one of the rows of contacts, which is pivoted into engagement with sides of the pins of a row opposite sides engaged by the spring contact probe electronic connectors. Pivoting of the wing can be effected either concurrently with, or immediately prior to, the spring contact probes being brought into engagement with their respective contacts.

Normally, the wing would be pivoted away from engagement with the contacts of the DIP. As structure mounting the spring contact probes is moved, however, to bring those probes into engagement with their respective contacts, a plunger carried by the mounting structure can effect pivoting of the wing to accomplish the support.

The present invention is, thus, an improved equipment for stopping items passing down a track and deterring damage being brought to bear upon the items. Additionally, it can include means for protecting contact pins of, for example, a DIP, when such items are those being passed down the track, and when spring contact probes are brought into engagement with the contact pins. More specific features and advantages obtained in view of those features will become apparent with reference to the DETAILED DESCRIPTION OF THE INVENTION, appended claims, and accompanying drawing figures.

BRIEF DESCRIPTION OF THE DRAWINGS

FIG. 1 is a perspective view of a DIP as known in the prior art;

FIG. 2 is a side elevational view of an equipment in accordance with the present invention, some portions thereof being broken away;

FIG. 3 is a plan view of the equipment of FIG. 2 taken generally along the line 3—3 of FIG. 2;

FIG. 4 is an enlarged plan view of a portion of the structure illustrated in FIG. 3;

FIG. 4a is a side sectional view of a stop taken along line 4a—4a of FIG. 4;

FIG. 7 is a sectional view taken along line 7—7 of FIG. 6.

DETAILED DESCRIPTION OF THE INVENTION

Figure 5:
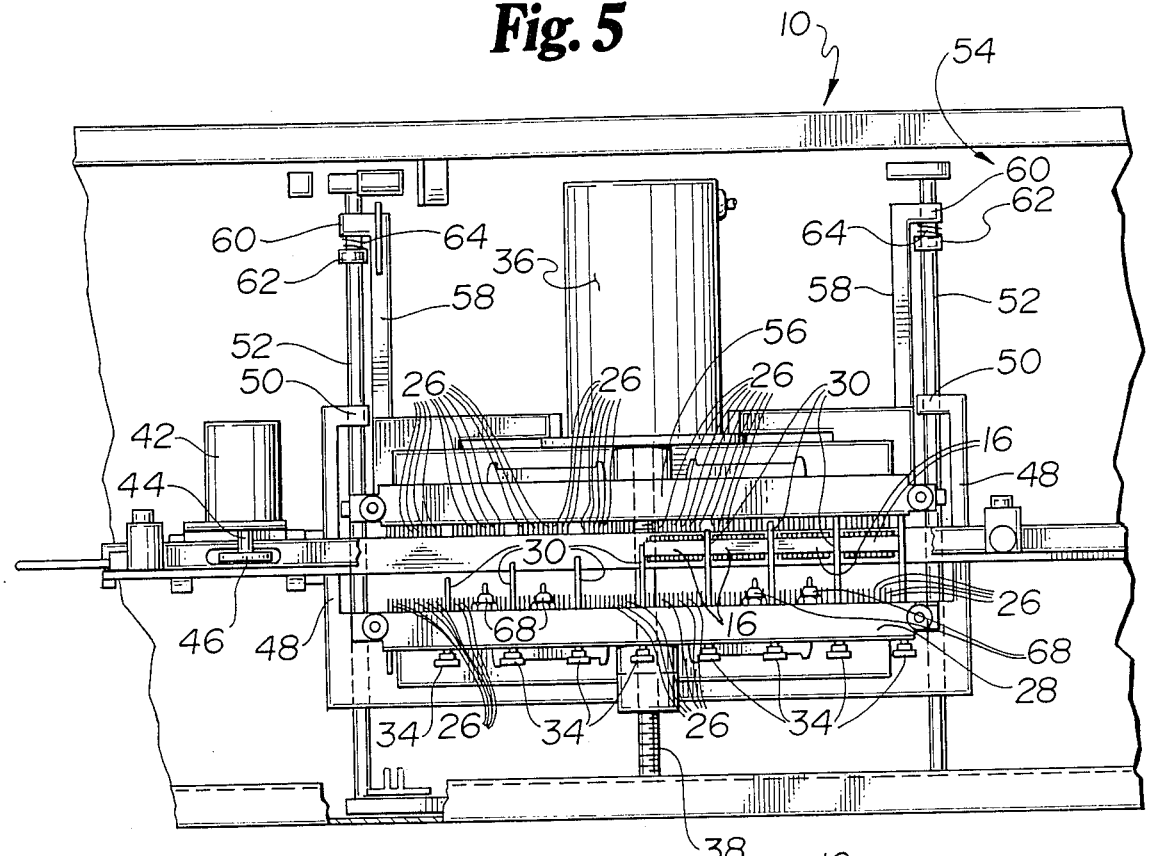
FIG. 5 is a view, similar to that of FIG. 3, showing the mount and stops carried thereby in positions wherein four DIPs are engaged and held at intended stations along a track.

Referring now to the drawings wherein like reference numerals denote like elements throughout the several views, a preferred embodiment of the invention for use in an EPROM programming equipment 10 is illustrated. Such an apparatus 10 employs a track extending at an angle downwardly from a feed mechanism generally illustrated at 14. Although not intended to be used exclusively for programming of dual in-line packages (DIPs), such a device is one type of package the programming application of the present invention is intended to service.

FIG. 1 illustrates such an integrated circuit device 16. The DIP 16 includes a main body 18 portion which is generally rectangular in shape and has a relatively small thickness compared to the length and width dimensions. Oppositely facing surfaces 20, 20' of the main body portion 18 are, typically, planar.

Each of opposite lateral edges 22, 22' of the main body portion 18 mount a row of contact pins 24. As seen in FIG. 1, these contact pins 24 initially emanate substantially perpendicular to the surfaces of the edges 22, 22', but, at a short distance from the point of departure from the edges, they are bent so that they, collectively, define a plane which is generally perpendicular to the oppositely facing surfaces 20, 20' of the main body portion 18. It is to be understood, however, that the planes defined by the contact pins 24 are at a slight angle to a perpendicular to the planes defined by the oppositely facing surfaces 20, 20' of the main body portion 18 in that they flare slightly. This flaring can be best seen in FIG. 7.

As known in the prior art, EPROM programmers define a plurality of stations at which devices to be programmed can be positioned. One or more master devices (not shown), already programmed in accordance with the manner in which the devices at the stations are to be dubbed, can be received in an appropriate socket or sockets (not shown). Electronic communication paths from the one or more master devices are provided to various electronic connectors 26 which are made to engage the contact pins 24 of the devices 16 to be programmed.

With the electronic connectors 26 in engagement with intended contact pins 24 of a device to be programmed, a current is driven through that device 16 to test for shorts. Once it is confirmed that no shorts exist, a voltage is applied to various pins 24 to effect the intended programming. Verification is performed to insure that programming was accomplished as was intended.

The sequence of steps performed in actually effecting programming is one known in the prior art. It will be understood that such a sequence is performmed when the present invention is used in an EPROM programming equipment application. The present invention resides, however, in the structure employed for positioning the devices 16 to receive the programming function at intended stations, for bringing the electronic connectors 26 into engagement with their corresponding pins 24, and for positioning, for example, a DIP 16 at the correct lateral position on the track 12 down which it moves and insuring that unacceptable deformation of the pins 24 does not occur because of engagement of the electronic connectors 26 therewith.

FIG. 3 illustrates an initial position of a stop mount 28, one which would be occupied prior to initiating a programming sequence. Referring then to that figure and FIG. 4, the stop mount 28 is illustrated as carrying a plurality of stops 30. While eight stops 30 are shown, it will be understood that any appropriate smaller or larger number could be employed.

As FIG. 3 illustrates, a stop 30 at the right end of the core section (that is, the portion of the equipment including the stations at which programming occurs) is shown as having the greatest length. This particular stop is at the lower end of the track 12 along which devices 16 to be programmed pass.

The next uppermost stop is provided with a slightly shorter length. Sequentially adjacent stops are provided with increasingly shorter lengths in a direction up the track 12.

The length differential between adjacent stops 30 is such that, as one stop 30 is brought into a position obstructing passage of devices 16 down the track 12, the next uppermost stop 30 will not protrude sufficiently to effect obstruction. Consequently, as a device is singulated (that is, isolated from a string of devices and permitted to pass downwardly into the core for programming), it will engage its intended stop 30 but be unobstructed by any stops above the intended stop.

Referring now to FIG. 4, it can be seen that the stop mount 28 also serves to carry electronic connectors 26 which provide the interface between the one or more master devices from which dubbing is to be effected and the devices 16 to be programmed. These electronic connectors 26, typically, take the form of spring contact probes. Employment of such probes for programming is known in the prior art, and the mere use of such structures in the present invention is not claimed to be inventive.

The spring contact probes 26 are organized into groups, each group corresponding with one of the stops 30 carried by the mount 28. FIG. 4 best illustrates this correspondence. The rightmost stop 30 is associated with the fourteen spring contact probes 26 immediately to its left, the second from the right stop 30 is associated with the fourteen probes 26 immediately to its left, etc.

As will be able to be seen in view of this disclosure, it is the intent of a stop 30 to position a device 16 to be programmed at a longitudinal location along the track 12 down which it passes such that the contact pins 24 of the device 16 can be engaged by corresponding spring contact probes 26. The spacing between the probes 26 and that between the lowermost probe 26 in a group and the corresponding stop 30 is made such that, when the stop 30 is engaged by the device 16 to be held in the particular station for programming, each of the contact pins 24 of the device 16 will be able to be engaged by a corresponding probe 26.

As will be garnered from this discussion, it is envisioned that groups of probes 26 could be replaced by a cartridge having spring contact probes with closer or more distant spacing, depending upon the spacing between the contacts or contact pins of the devices 16 being programmed. With a similar intent in mind, the present invention provides structure for tuning the position of the device 16 to be programmed longitudinally along the track 12 at the particular station.

FIG. 4a illustrates a stop 30 in cross-section. That figure shows a stop 30 as having one side 32 thereof reduced in dimension so that the stop 30 is eccentric, at least at a location therealong at which it is engaged by a device 16 on the track 12. An adjustment dimension A can, thereby, be provided. That is, when the stop 30 is oriented as it is shown in solid line in FIG. 4a, the position at which a device 16 on the track 12 will be maintained will be lower than any other at which it will be maintained when the stop 30 is rotated. If the stop 30 is rotated 180 degrees, the device 16 on the track 12 will be maintained at its highest position. By changing the angular positioning of the stop 30, adjustment can be made anywhere between the two extremes.

The stops 30 can be "ganged" by means of a rack 33, a gear 34 associated with each stop 30 in engagement with rack 33, and an adjustment knob 35 which is operatively connected to rack 33 to move rack 33 longitudinally as knob 35 is drawn along a slot (not shown). By movement of knob 35, therefore, stops 30 can be commensurately rotated to vary the locations at which devices 16 on the track 12 are stopped. Because of the "ganging" feature, all of the stops 30 can be adjusted concurrently. Each stop 30 would, of course, be geared to rack 33 so that, at any one time, it would present an eccentricity similar to that presented by all other stops 30.

Figure 6:
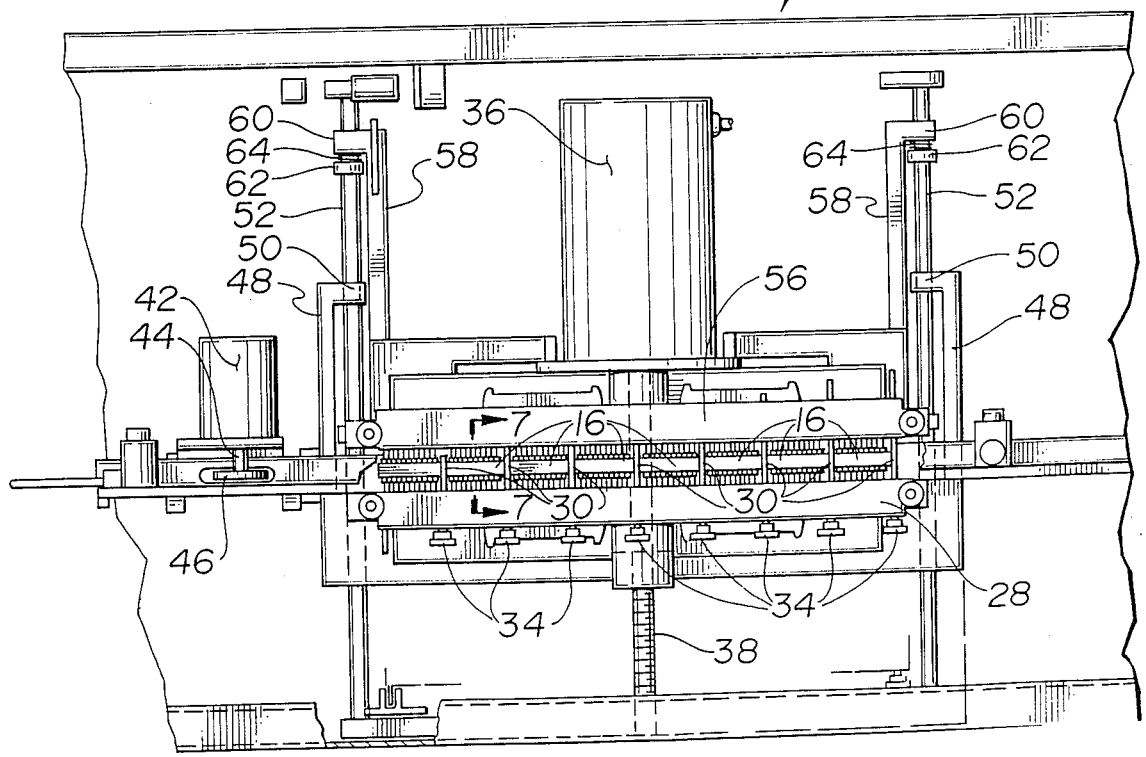
FIG. 6 is a view similar to that of FIG. 5 showing the mount and stops carried thereby in positions wherein each stop carried by the mount is engaged by a DIP to hold the DIPs in intended stations.

FIGS. 3, 5, and 6 illustrate the employment of a motor 36 to effect movement of the stop mount 28 in a direction generally transverse to an axis along which devices 16 to be programmed pass down the track 12. In the embodiment illustrated, a lead screw 38 extends from the motor 36 and is journaled at an end opposite that at which it extends from the motor 36, at a bushing 40. The screw 38 passes through an internally threaded apperture in the mount 28 so that, as the screw 38 is made to rotate, the mount will move therealong.

The motor 36 is controlled by control means (not shown), sensors (not shown) being employed to ascertain when a device 16 is in a station in engagement with its corresponding stop 30. Such information can be inputted to the control means, and functioning of the motor 36 can be made to be responsive to this information. The motor 36 will, therefore, sequentially be actuated to move the stop mount 28 inwardly toward the track 12 in increments so that each stop 30 will, in sequence, successively obstruct the track 12, but only after a device 16 has passed down the track 12 and been position in station by the immediately lower stop 30.

The control means, similiarly, govern actuation of the singulator motor 42. A shaft 44 extending from the motor 42 mounts a disk 46 and disposes that disk 46 immediately above the track 12. Spacing between the periphery of the disk 46 and the track 12 approximates the thickness of a main body portion 18 of a device 16 to be programmed. It is small enough such that, unless the disk 46 is made to rotate, devices 16 will not be permitted to pass down the track 12. It is sufficiently large, however, such that, as the disk 46 is made to rotate by the motor 42, a device 16 will be urged along the track 12 and be permitted to pass, thereafter, down along the track 12 into the core section of the programming equipment 10. The material from which the disk 46 is made can be such that it will not cause damage to be imparted to the devices 16 singulated.

The mount 28 is shown as including a guidance arm 48 extending from each end thereof. The arms 48 are shown as extending generally perpendicular to an axis of elongation of the mount 28 and carry at distal ends thereof bushings 50. A pair of guidance shafts 52, oriented generally normal to the axis along which devices 16 pass down the track 12, are mounted to a base plate 54 of the equipment 10, and the bushings 50 at the distal ends of the guidance arms 48 ride on the shafts 52. The intended orientation of the mount 28 generally parallel to the track 12 is, therefore, facilitated.

A block 52, similar in construction to the stop mount 28 is provided on a side of the track 12 opposite that of the stop mount 28. The block 56 is provided with groups of spring contact probes 26 corresponding to those carried by the stop mount 28. The probes 26 on the block 56 function to accomplish the same purpose as do those on the stop mount 28 but with respect to the contact pins 24 of devices 16 passing down the track 12 on a side of the track 12 opposite those engaged by the stop mount probes.

Normally, the block 56 is retracted laterally so as not to give rise to any chance of inadvertant engagement of the devices 16 by the probes 26 as the devices 16 pass down the track 12. This can be accomplished by providing either end of the block 56 with an arm 58 having a bushing 60 therein which rides along the transverse shafts 52. Shoulders 62 can be provided on the shafts 52 at locations intermediate the block arm bushings 60 and the track 12, and by interposing a coil spring 64 between each shoulder 62 and bushing 60.

In operation, a storage and feed tube containing, for example, DIPs 16 can be placed in the feed mechanism 14 and the DIPs 16 released therefrom when an open end of a tube is in registration with the track 12. The devices 16 to be programmed will stack up above the singulator disk 46, and only one device 16 will be released to pass into the core section of the programmer in response to the control means actuating the singulator motor 42. Prior to singulation of the first device, the stop mount and block 56 will be in the positions illustrated in FIG. 3. As sensing means (not shown) ascertain that a device 16 is at the singulator disk 46 and available to be released into the core section, the control means will initiate movement of the stop mount 28 so that the lowermost stop 30 is brought into a position obstructing the track 12. When the first stop is in this position, the singulator motor 42 will be actuated to release one device 16, and the device 16 will pass down the track 12 until it engages the lowermost stop 30.

As can be seen, this device 16 will have the greatest distance to "free fall" along the track 12 until it engages its stop 30. Because of the fragile nature of the main body portions 18 of some integrated circuit devices 16, it is desirable that the impact of engagement be minimized. Because of the construction of the stop mount 28 and the various stops 30 carried thereby, the net effect will be such minimization. Because the stops 30 are cantilevered with respect to the mount 28, a longer stop will tend to absorb more of the energy of the device 16 by which it is engaged, and a sufficient measure of resiliency is given to the stops 30 to augment this effect.

When the device 16 has passed down the track 12 and has come to rest in engagement with the lowermost stop 30, the stop mount 28 will again be moved incrementally toward the track 12 until the second lowermost stop is in position obstructing the track 12. When this position has been achieved, the motor 42 effecting singulation will, again, be actuated to release another device 16. This process will continue until each station is filled.

As will be able to be seen in view of this disclosure, more upwardly stops 30, because of their shorter lengths, will tend to absorb less energy of the device 16 to be programmed passing down the track 12. It will be understood, however, that, although the stops 30 are shorter in a direction passing upwardly along the track 12, the devices 16 to be programmed which pass down the track 12 will have a shorter distance to "free fall". Consequently, it will be able to be seen that there is a correspondence between the length of a stop 30 and the distance a device 16 which engages it "free falls".

When all stations are filled, the motor 36 driving the stop mount 28 will continue to move that mount 28 inwardly. Eventually, the spring contact probes 26 will engage the contacts 24 of the integrated circuit device 16.

When the devices 16 to be programmed are DIPs, certain precautions are, typically, taken to minimize the incidence of damage to the contact pins 24 thereof. The prior art has employed spring contact probes for engagement for programming, since these structures employ heads which telescope relative to a main body of the probe. Shafts on which the heads are mounted can be spring biased outwardly but be sufficiently responsive so that, when the heads engage the contact pins 24 of the device 16, inward movement will be afforded.

Often, however, such mechanisms do not provide sufficient protection, and the present invention employs a feature to further protect the DIP contact pins 24. FIG. 7 illustrates an alignment device which includes a pair of wings 66 which extend downwardly between the rows of DIP contacts 24. When a device 16 is passing from the singlator 46 to its intended stop 30, the wings 66 are pivoted so that lower portions thereof which extend between the rows of contacts 24 are retracted inwardly so as not to obstruct movement of devices down the track 12. When a device 16 has achieved its programming position, however, a plunger carried by the stop mount 28 can engage an upper end of the wing 66 most closely proximate the mount 28. This engagement will effect pivoting of that wing 66 until the lower extremities of the wings 66 are sufficiently far apart to provide support to the contact pins 24 of the DIP 16 and resist any deformation that might occur to them because of engagement by the probes 26.

FIG. 7 illustrates a structure wherein only the wing 66 engaged by the stop mount plunger 68 pivots. That figure, however, illustrates another plunger 68' carried by the block 56. In certain embodiments, the wing 66' most closely proximate the block 56 could also be made to pivot. Engagement of a portion above the axis of pivoting by the plunger 68' would effect outward lateral movement of the lower end of that wing 66 also.

Regardless of which, and how many, wings pivot, however, what is important is that the lower extremities of the wings 66, 66' be, at the time of engagement of the contacts 24 by the probes 26, sufficiently separated to adequately support the contact pins 24 of the device 16 to be programmed. Dimensions of the plunger or plungers 68, 68', thicknesses of the wings 66, 66', and other dimensions can be made so that this is accomplished and that the DIP 16 to be programmed is positioned at a correct lateral location on the track 12.

As previously indicated, it is necessary that the block 56 be able to be moved laterally toward the track 12 so that the probes 26 carried thereby can engage their corresponding contact pins 24 on the DIP 16. As previously discussed, the block 56 is normally biased outwardly from the track 12. Movement of the block 56 can be effected independent of the lateral movement of the stop mount 28. It is envisioned, however, that movement of the block 56 be responsive to movement of the stop mount 28. The figures illustrate such an embodiment. In this embodiment, the block 56 is pulled so that its probes 26 engage their corresponding contact pins 24 of the device 16 when the force of the spring plungers and the probes 26 of the stop mount 28 is greater than the spring force biasing the block 56.

Numerous characteristics and advantages of the invention of this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for engaging and stopping, in an intended position, each of a plurality of items passing down a track, comprising:
   (a) a mount spaced laterally from the track and disposed for movement toward and away from the track;
   (b) a plurality of stops rigidly carried by said mount and spaced along an axis generally parallel to an axis along which items pass down the track, each of said stops, as said mount moves toward the track, successively obstructing the track in consecutive sequence in a direction upwardly along said axis along which said stops are spaced; and
   (c) means for selectively moving said mount toward and away from the track.

2. Apparatus in accordance with claim 1 wherein said mount is oriented generally parallel to the axis along which items pass down the track to define said axis along which said stops are spaced, and wherein said stops are generally parallel to one another and define paths of movement substantially perpendicular to the axis along which items pass down the track.

3. Apparatus in accordance with claim 2 wherein said stops are spaced from one another at substantially equal distances.

4. Apparatus in accordance with claim 2 wherein each of said stops is disposed for selective rotation about an axis along which said each stop moves as said mount is moved toward and away from the track, and wherein said each stop is eccentric with respect to said axis about which it rotates, whereby the position at which an item on the track to engage a particular stop is arrested is varied by rotating said particular stop about said axis with respect to which it is disposed for rotation.

5. Apparatus in accordance with claim 2 wherein said means for moving said mount comprises means for incrementally urging said mount toward the track so that a lower of said stops is made to obstruct the track and be engaged by an item passing down the track before the next higher stop is brought into a position obstructing the track.

6. Apparatus in accordance with claim 5 wherein said means for incrementally urging said mount comprises:
   (a) a single motor; and
   (b) a lead screw, operatively connected to said mount, driven by said motor.

7. Apparatus in accordance with claim 2 wherein each of said stops is resilient and is cantilevered at said mount, a lower of said stops extending from said mount farther than the next higher stop.

8. Apparatus for engaging and stopping, at a designed location, each of a plurality of dual-in-line package integrated circuit devices (DIPs), each having a plurality of deformable contacts extending from at least one of opposite lateral edges of a main body portion of the DIP to define a plane generally perpendicular to a plane defined by the main body portion of the DIP, passing down a track, and for programming the DIPs while at their designed locations, comprising:
   (a) a mount spaced laterally from the track and disposed for movement toward and away from the track;
   (b) a plurality of resilient stops rigidly cantilevered at said mount and spaced along an axis generally parallel to an axis along which DIPs pass down the track, each of said stops, as said mount moves toward the track, successively obstructing the track in consecutive sequence in a direction upwardly along said axis along which said stops are spaced;
   (c) a plurality of electronic connectors, associated with each of a plurality of stations defined by the designed locations at which the DIPs are stopped, disposed on opposite sides of the track to engage the deformable contacts of DIPs stopped at the various stations and program the DIPs by driving current therethrough and applying voltage across various contacts thereof;
   (d) means for urging said connectors into engagement with corresponding deformable contacts of DIPs stopped at the various stations; and
   (e) means for selectively moving said mount toward and away from the track.

9. Apparatus in accordance with claim 8 further comprising backing means for supporting deformable contacts of the DIPs to deter deformation of the contacts when said connectors are brought into engagement therewith.

10. Apparatus in accordance with claim 9 wherein said backing means comprises:
   (a) a wing, pivotally mounted for movement between a position wherein one end thereof is made to engage a side of a deformable contact opposite a side thereof engaged by one of said electronic connectors, and a normal position wherein said end of said wing is retracted away from the deformable contact;

(b) means biasing said wing to its normal position; and (c) means for pivoting said wing against said biasing as one of said electronic connectors engages a deformable contact, into engagement with the side of the contact opposite that engaged by the electronic connector.

11. Apparatus in accordance with claim 8 wherein said mount is oriented generally parallel to the axis along which DIPs pass down the track to define said axis along which said stops are spaced, and wherein said stops are generally parallel to one another and define paths of movement substantially perpendicular to the axis along which DIPs pass down the track.

12. Apparatus in accordance with claim 11 wherein said stops are spaced from one another at substantially equal distances.

13. Apparatus in accordance with claim 11 wherein each of said stops is disposed for selective rotation about an axis along which said each stop moves as said mount is moved toward and away from the track, and wherein said each stop is eccentric with respect to said axis about which it rotates, whereby the position at which a DIP on the track to engage a particular stop is arrested is varied by rotating said particular stop about said axis with respect to which it is disposed for rotation.

14. Apparatus in accordance with claim 11 wherein said means for moving said mount comprises means for incrementally urging said mount toward the track so that a lower of said stops is made to obstruct the track and be engaged by a DIP passing down the track before the next higher stop is brought into a position obstructing the track.

15. Apparatus in accordance with claim 14 wherein said means for incrementally urging said mount comprises:

(a) a single motor; and (b) a lead screw, operatively connected to said mount, driven by said motor.

* * * * *